(12) United States Patent
Miki et al.

(10) Patent No.: US 6,785,147 B2
(45) Date of Patent: Aug. 31, 2004

(54) CIRCUIT MODULE

(75) Inventors: Katsumasa Miki, Osaka (JP); Yuji Mido, Osaka (JP); Tetsuhiro Korechika, Osaka (JP); Suzushi Kimura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/381,891

(22) PCT Filed: Jul. 23, 2002

(86) PCT No.: PCT/JP02/07424

§ 371 (c)(1),
(2), (4) Date: Jun. 23, 2003

(87) PCT Pub. No.: WO03/013200

PCT Pub. Date: Feb. 13, 2003

(65) Prior Publication Data

US 2004/0095710 A1 May 20, 2004

(30) Foreign Application Priority Data

Jul. 31, 2001 (JP) ........................................ 2001-231444

(51) Int. Cl.[7] ................................................. H05K 7/02
(52) U.S. Cl. ........................ 361/760; 361/523; 361/541; 361/763
(58) Field of Search ................................ 361/760, 761, 361/763, 766, 807, 302, 306.1, 328, 541, 523

(56) References Cited

U.S. PATENT DOCUMENTS

| | | | | |
|---|---|---|---|---|
| 5,005,107 A | * | 4/1991 | Kobashi et al. | 361/540 |
| 5,586,001 A | * | 12/1996 | Amano et al. | 361/525 |
| 6,005,197 A | * | 12/1999 | Kola et al. | 174/260 |
| 6,324,067 B1 | * | 11/2001 | Nishiyama | 361/761 |
| 6,373,714 B1 | * | 4/2002 | Kudoh et al. | 361/760 |

FOREIGN PATENT DOCUMENTS

| | | |
|---|---|---|
| EP | 0 920 085 | 6/1999 |
| JP | 4-283987 | 10/1992 |
| JP | 6-176980 | 6/1994 |
| JP | 2000-243873 | 9/2000 |
| JP | 2001-185460 | 7/2001 |
| JP | 2001-297951 | 10/2001 |
| JP | 2001-307956 | 11/2001 |
| JP | 2002-299161 | 10/2002 |

* cited by examiner

Primary Examiner—Anthony Dinkins
(74) Attorney, Agent, or Firm—Wenderoth, Lind & Ponack, L.L.P.

(57) ABSTRACT

The present invention aims to provide a circuit module that includes a sheet-like solid electrolytic capacitor and reduces an area and volume required for mounting electronic components. In the sheet-like solid electrolytic capacitor, valve metal sheet 11 has dielectric layer 13 and current collector layer 12 formed on the surface thereof, and is packaged by insulators 14 and 15. The circuit module is structured to embed the sheet-like solid electrolytic capacitor in a circuit board.

20 Claims, 6 Drawing Sheets

CIRCUIT MODULE

TECHNICAL FIELD

The present invention relates to a capacitor-incorporating circuit module for use in an electric appliance and electronic equipment.

BACKGROUND ART

A conventional circuit module is structured so that components, such as an integrated circuit, capacitor, inductor, and resistor, are disposed on a circuit board. Because of this structure, the components protrude from the surface of the board when mounted. This increases the volume of the entire circuit board and additionally increases the area of the circuit board by the area of the portion where the components are mounted. For this reason, it is inevitable that the volume of equipment using this circuit board is large.

DISCLOSURE OF THE INVENTION

The present invention aims to provide a circuit module of which volume and area are not increased by mounting and that contributes to downsizing of equipment incorporating the circuit module. To achieve this object, the present invention is structured to embed a sheet-like solid electrolytic capacitor inside of a circuit board.

BEST MODE FOR CARRYING OUT THE INVENTION

Figure 1:
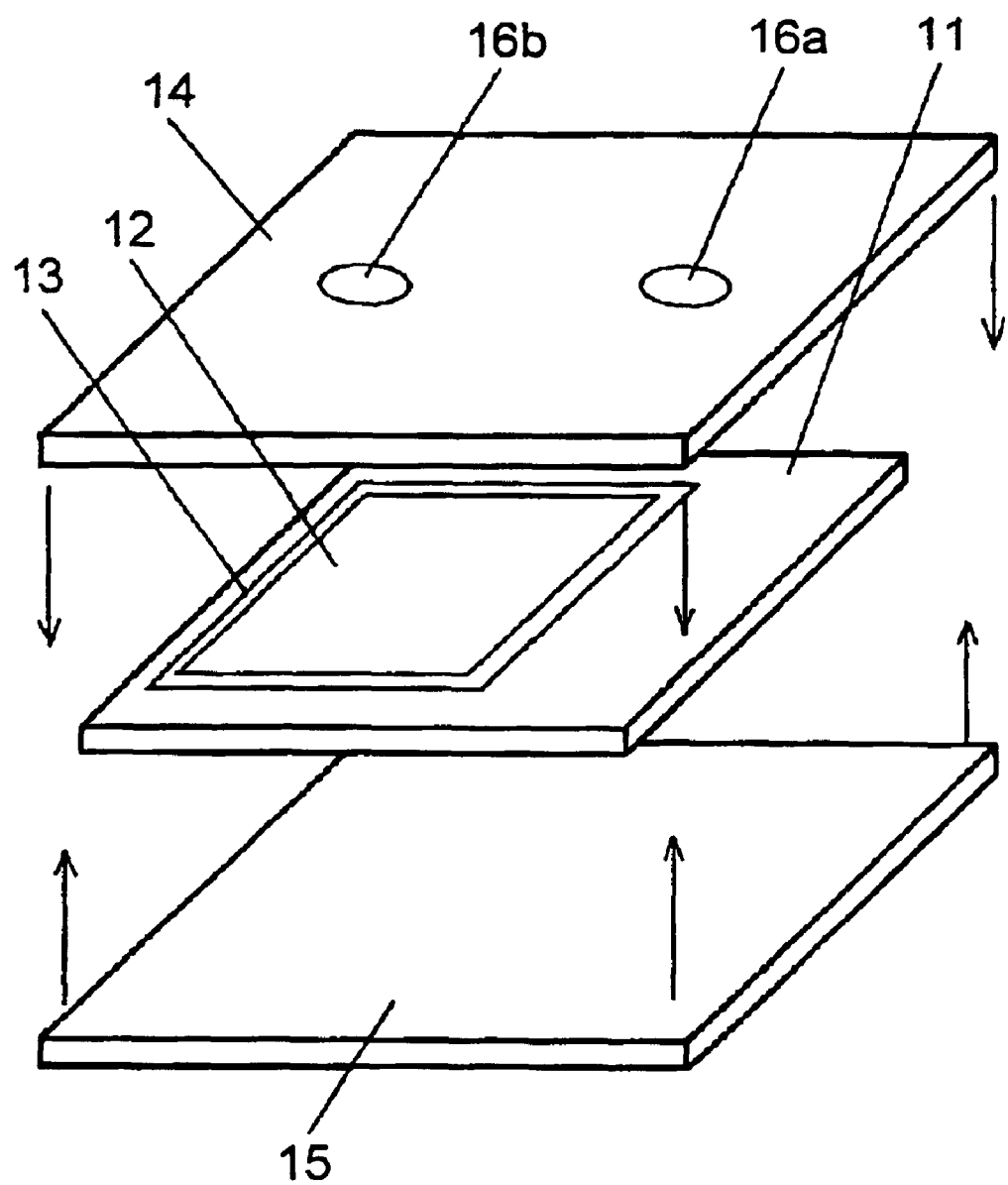
FIG. 1 is an exploded perspective view of a sheet-like solid electrolytic ATTACHMENT B capacitor in accordance with a first exemplary embodiment of the present invention.

The present invention provides a circuit module incorporating a sheet-like solid electrolytic capacitor into a circuit board thereof. The sheet-like solid electrolytic capacitor is structured to have a valve metal sheet body that has an electrode portion on at least one side thereof, and porous portions on the other side opposite the electrode portion. The sheet-like solid electrolytic capacitor is also structured so that a dielectric layer is provided on the porous portions of the valve metal sheet body, a solid electrolytic layer is provided on this dielectric layer, and a current collector layer is formed on this solid electrolytic layer. Embedding the sheet-like solid electrolytic capacitor into the circuit board can make the circuit module remarkably thin.

The present invention also provides a circuit module in which a circuit board thereof has a receiving recess, the receiving recess receives a sheet-like solid electrolytic capacitor, and the circuit board and the solid electrolytic capacitor are electrically connected to each other. This structure allows the sheet-like solid electrolytic capacitor to be embedded and an electrode thereof to be led out easily.

The present invention further provides a circuit module in which a circuit board thereof has an opening, the opening receives a sheet-like solid electrolytic capacitor, and the circuit board and the solid electrolytic capacitor are electrically connected to each other. This structure allows electrical connection between the sheet-like solid electrolytic capacitor and both sides of the circuit board, thereby increasing the degree of wiring freely.

The present invention further provides a circuit module in which a sheet-like solid electrolytic capacitor has an outer insulator, and external terminals provided on the end face of the outer insulator are electrically connected to conductors in the circuit board thereof. This structure facilitates electrical connection between the sheet-like solid electrolytic capacitor and the inside of the circuit board.

The present invention further provides a circuit module in which the exposed surface of a sheet-like solid electrolytic capacitor incorporated into a circuit board has lead terminals connected to an electrode portion and a current collector layer of the solid electrolytic-capacitor, and the lead terminals are electrically connected to conductors on the circuit board. This structure facilitates electrical connection between the sheet-like solid electrolytic capacitor and the surface of the circuit board.

The present invention further provides a circuit module in which the exposed surface of a sheet-like solid electrolytic capacitor incorporated into a circuit board has a plurality of lead terminals connected to an electrode portion and a current collector layer of the solid electrolytic capacitor, and the lead terminals can electrically be connected to other electronic components. This structure can reduce the volume required for mounting components and the length of wiring, thereby reducing the resistance component (ESR) and reactance component (ESL).

The present invention further provides a circuit module in which a sheet-like solid electrolytic capacitor having other electronic components connected to lead electrodes on at least one side thereof is incorporated into a circuit board. This structure can reduce the volume of the circuit board and components after mounting. Additionally, because the sheet-like solid electrolytic capacitor and the components are protected by the circuit board, high reliability can be ensured.

The present invention further provides a circuit module using a semiconductor component. For this module, because a sheet-like solid electrolytic capacitor and the semiconductor component can be connected directly to each other, voltage fluctuation resulting from the ESR and ESL can be reduced. This contributes to stabilization of the performance of the semiconductor component.

The present invention further provides a circuit module in which a sheet-like solid electrolytic capacitor is incorporated into at least any one of layers constituting a multilayered circuit board. Multilayering circuit boards increases the degree of incorporating components freely, thus contributing to downsizing of the entire module.

The present invention further provides a circuit module in which a sheet-like solid electrolytic capacitor is incorporated into at least the surface layer constituting the multilayered circuit board. For this module, because disposing the sheet-like solid electrolytic capacitor in any position in the surface layer allows components to be mounted directly onto the solid electrolytic capacitor in the surface layer of the board, various kinds of components can easily be mounted and connected.

First Exemplary Embodiment

A specific description is provided of the first exemplary embodiment hereinafter with reference to the accompanying drawings.

FIG. 1 is a perspective view of a circuit module in accordance with the first exemplary embodiment of the present invention. In the first exemplary embodiment, aluminum foil is used as valve metal sheet body 11. Part of one side of the aluminum foil is etched to have a roughed surface and porous portions. After the surface area thereof is increased by etching, the surface is subjected to oxidation treatment to form dielectric layer 13, an oxide layer.

Figure 2:
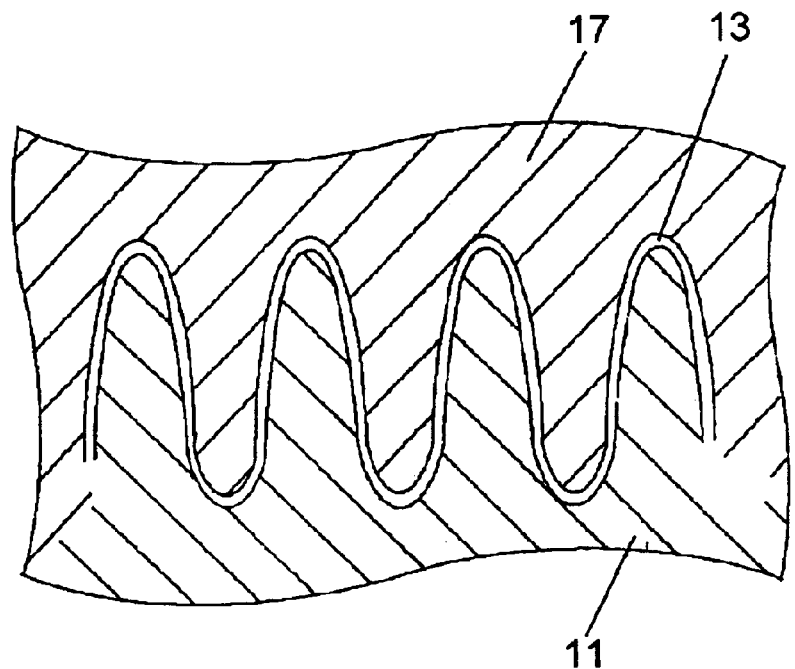
FIG. 2 is a simplified sectional view of an essential part of the sheet-like solid electrolytic capacitor in accordance with the first exemplary embodiment of the present invention.

FIG. 2 is an enlarged view of a section showing the surface portion of valve metal sheet body 11. Valve metal sheet body 11 made of aluminum foil has a large number of microporous portions formed by etching. Formed on the surface of micropores by the oxidation treatment is thin dielectric layer 13, which works as dielectrics. Further, in order to provide the inside of the microporous portions (not shown) with electrical connection, solid electrolytic layer 17 is formed by chemical polymerization or electrolytic polymerization using a functional polymer layer made of a material, such as polypyrrole or polythiophene. Provided on solid electrolytic layer 17 is current collector layer 12 shown in FIG. 1. The unetched portion of valve metal sheet body 11 acting as an electrode and this current collector layer 12 work together to form a capacitor portion.

This capacitor portion is mounted and sealed while being sandwiched between upper insulator 14 and lower insulator 15. In upper insulator 14, connecting terminals 16a and 16b are formed by filling through holes with electrically conductive material. Connecting terminal 16a has electrical connection with the unetched portion of valve metal sheet body 11. Connecting terminal 16b has electrical connection with current collector layer 12. This structure provides electrical connection between the capacitor portion and the outside thereof.

Figure 3:
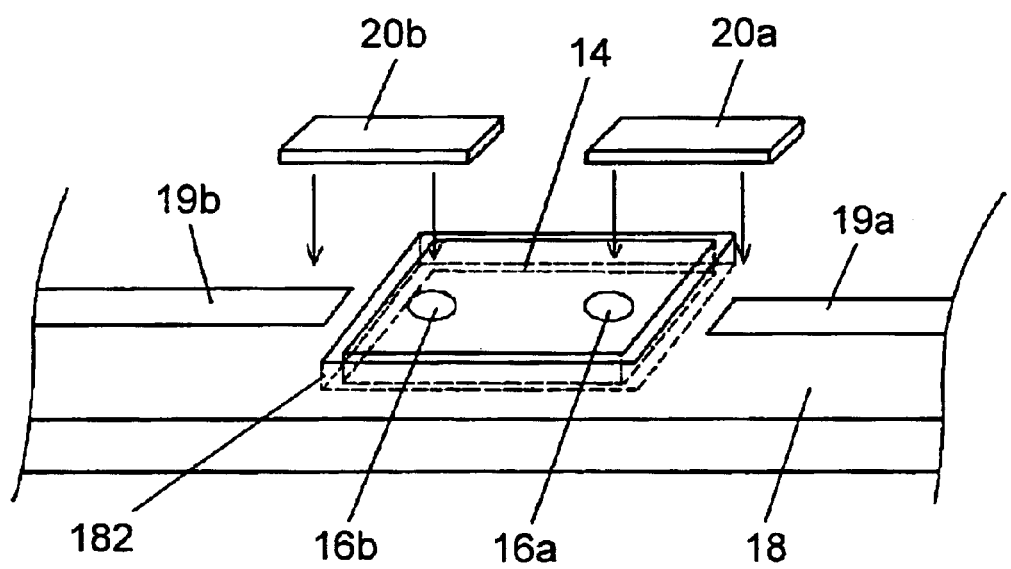
FIG. 3 is an exploded perspective view of a circuit module in accordance with the first exemplary embodiment of the present invention.

The sheet-like solid electrolytic capacitor is embedded into a circuit board in the form shown in FIG. 3, for example. Circuit board 18 has a stepped hole 182 for receiving insulators 14 and 15. Mounted into the hole is the sheet-like solid electrolytic capacitor made of insulators 14 and 15 incorporating the capacitor portion therebetween. On the surface of circuit board 18, wiring patterns 19a and 19b are formed. Wiring patterns 19a and 19b have electrical continuity with connecting terminals 16a and 16b via conductors 20a and 20b provided therebetween, respectively.

Mounting the sheet-like solid electrolytic capacitor into hole 182 in circuit board 18 so that the capacitor is embedded therein can reduce the volume of the entire circuit board 18 after components are mounted. This can also reduce the volume of electronic equipment using this circuit module. A rough surface can easily be formed on aluminum foil to increase the area. Additionally, because dielectric layer 13 is thin and dense, the capacitance can be increased and larger capacitance can be ensured in the form of a sheet. Thus, the solid electrolytic capacitor of this structure is suitable to be embedded into circuit board 18.

In the first exemplary embodiment, aluminum foil is used as valve metal sheet body 11. Other materials, such as tantalum, in which a dielectric layer can be formed on the surface thereof can also be used. The dielectric layer can also be formed by coating of organic material or using a thin film technique, such as sputtering and plasma polymerization.

Second Exemplary Embodiment

A specific description is provided of the second exemplary embodiment hereinafter with reference to the accompanying drawings.

Figure 4:
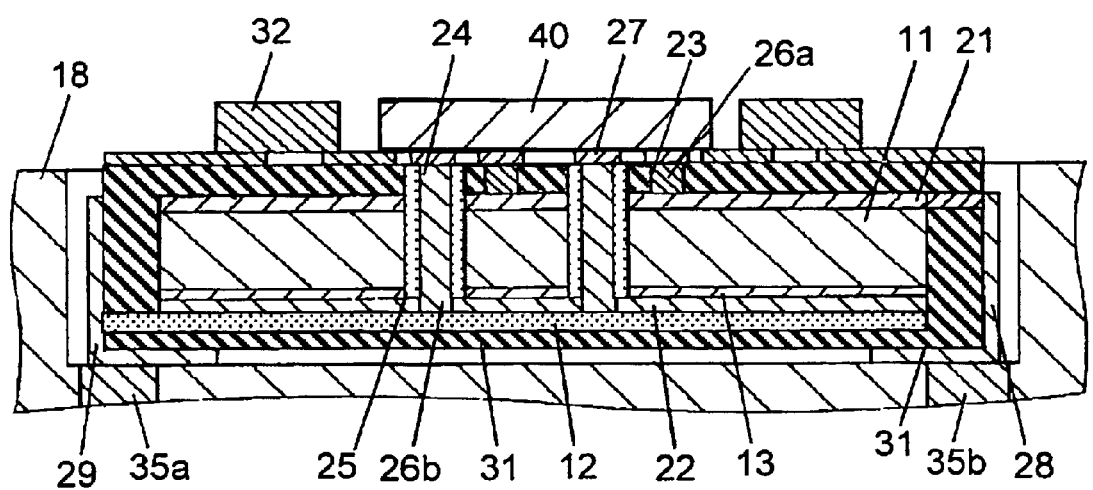
FIG. 4 is a sectional view of a circuit module in accordance with a second exemplary embodiment of the present invention.

FIG. 4 is a sectional view mainly showing a capacitor portion in the second exemplary embodiment of the present invention.

Valve metal sheet body 11 is made of aluminum foil having an etched side. Electrode portion 21 is provided on one side of this valve metal sheet body 11. As this electrode portion 21, the unetched side can be used without any treatment in the case of aluminum foil. It is also possible to form another layer made of a metal, such as gold, copper, and nickel, on the unetched side to improve electrical conductivity and environmental resistance. This other layer can be formed by vacuum deposition, sputtering or electroplating.

Further, valve metal sheet body 11 except electrode portion 21 is anodized to form dielectric layer 13 on the etched rough surface thereof and the surface of micropores. Further formed on dielectric layer 13 by chemical polymerization or electrolytic polymerization is solid electrolytic layer 22 made of a material, such as polypyrrole or polythiophene.

Further, current collector layer 12 on solid electrolytic layer 22 can be formed by bonding conductive metal foil or applying conductive paste on solid electrolytic layer 22. Insulating portion 31 is provided for covering these entire portions, and formed by molding using epoxy resin or other materials. As shown in the drawing, through hole 23 is a hole that penetrates insulating portion 31 and reaches electrode portion 21. Through hole 24 is a hole that penetrates insulating portion 31, electrode portion 21, valve metal sheet body 11, dielectric layer 13, and solid electrolytic layer 22, and reaches current collector layer 12. These through holes 23 and 24 are formed by laser machining, etching, punching, and other methods.

Insulating film 25 is formed on the inner wall of the through hole 24. These through holes 23 and 24 are further subjected to copper plating or other treatment to form conductors 26a and 26b, respectively. Conductor 26a in through hole 23 is structured to be electrically connected to electrode portion 21 only. Conductor 26b in through hole 24 is structured to be electrically connected to current collector layer 12 only.

On the exposed surfaces of conductors 26a and 26b formed in these through holes 23 and 24, respectively, connecting bumps 27 made of a material, such as solder, gold, tin, or silver, are formed. The number and pitch of these connecting bumps 27 is equal or larger than that of the connecting bumps on semiconductor component 40 to be mounted afterwards. Connecting bumps 27 that are not used for connection to the connecting bumps on semiconductor component 40 can be used for mounting other components 32, such as a chip resistor, chip ceramic capacitor, and chip inductor.

Additionally, formed on the side faces and bottom face of insulating portion 31 are external terminals 28 and 29, each connected to the electrode portion 21 and current collector layer 12. External terminals 28 and 29 are electrically connected to through-hole electrodes 35a and 35b provided in circuit board 18, respectively, and have electrical connection with the outside of the capacitor.

Chip-like components 32, such as a chip resistor, chip ceramic capacitor, and chip inductor, are further mounted on insulating portion 31, to form a circuit module.

In this manner, semiconductor component 40 and the like can be mounted on one side of the sheet-like solid electrolytic capacitor. This eliminates the need of wiring patterns for routing and thus remarkably improves high-frequency response. In other words, a failure such that small resistance or inductance existing in the wiring patterns fluctuates the voltage and the fluctuation causes malfunctions of semiconductor component 40 can be prevented. Especially when high-frequency voltage is applied and the rise time becomes shorter, voltage drop caused by inductance components becomes larger. For this reason, the present invention that can prevent such a failure is highly useful. By further incorporating other components 32 constituting the circuit, a thin circuit module can be realized.

Figure 5:
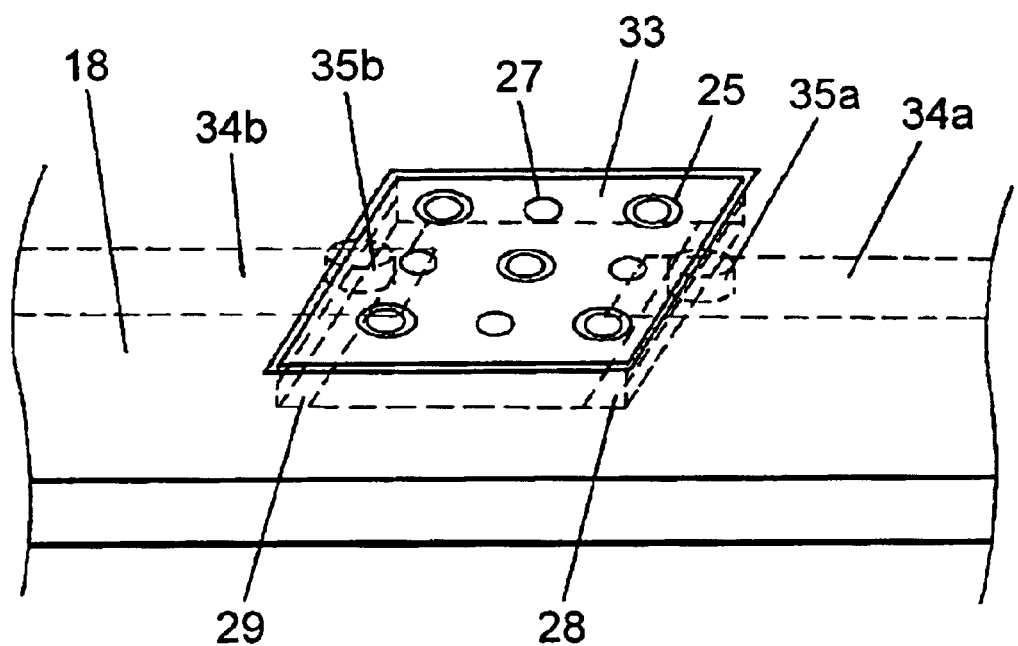
FIG. 5 is a perspective view of the circuit module in accordance with the second exemplary embodiment of the present invention.

The present invention is structured so that the above-mentioned sheet-like solid electrolytic capacitor is embedded into circuit board 18. FIG. 5 is a perspective view showing how a sheet-like solid electrolytic capacitor is embedded into a circuit board.

Sheet-like solid electrolytic capacitor 33 is structured as described above. Circuit board 18 has a recess capable of receiving sheet-like solid electrolytic capacitor 33. Circuit board 18 also has through-hole electrodes 35a and 35b made of through holes filled with conductive material, directly under external terminals 28 and 29 of sheet-like solid electrolytic capacitor 33, to ensure electrical connection between the back face of circuit board 18 and sheet-like solid electrolytic capacitor 33. Provided on the back face of circuit board 18 are wiring patterns 34a and 34b, which have electrical connection with through-hole electrodes 35a and 35b, respectively. Because of this structure, when sheet-like solid electrolytic capacitor 33 is mounted into circuit board 18, power is supplied to solid electrolytic capacitor 33 from the back face of circuit board 18.

With such a structure, because the body of sheet-like solid electrolytic capacitor 33 does not protrude outside, or because the hight of the capacitor 33 is smaller than the thickness of the circuit board 18, the volume of the circuit module can be reduced. Further, the moment sheet-like solid electrolytic capacitor 33 is embedded into circuit board 18, electrical connection with the outside thereof can easily be obtained. Additionally, it is possible to mount other components directly on this sheet-like solid electrolytic capacitor 33 and the back face of circuit board 18. It is also possible to mount other components directly under sheet-like solid electrolytic capacitor 33., Therefore, the area of circuit board 18 can drastically be reduced. Further, because additional wiring is not required between sheet-like solid electrolytic capacitor 33 and other components as described above, electrical loss can further be reduced.

Figure 6:
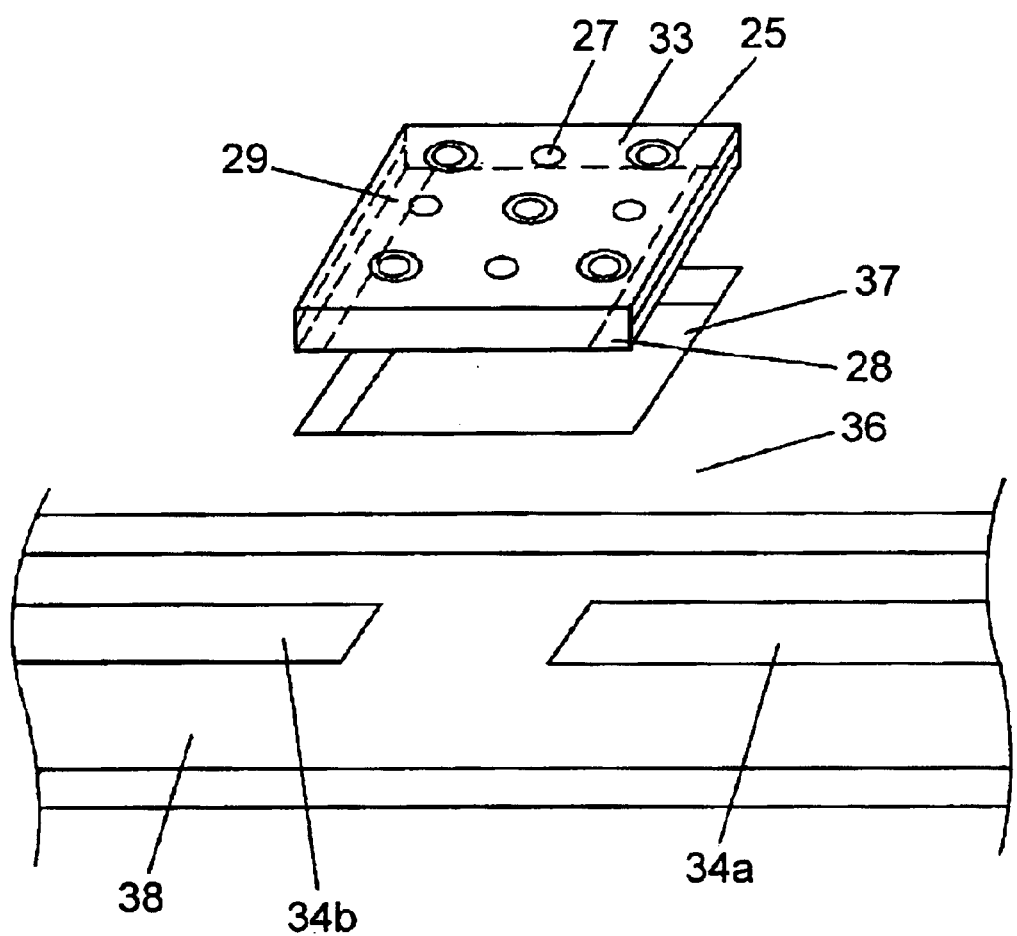
FIG. 6 is an exploded perspective view of a circuit module in accordance with the second exemplary embodiment of the present invention.

FIG. 6 is also an exploded perspective view showing how a sheet-like solid electrolytic capacitor is embedded in a circuit board.

A multilayered circuit board is made of first circuit board 36 having opening 37 and second circuit board 38 for mounting. Sheet-like solid electrolytic capacitor 30 is structured to be received in capacitor opening 37 in the first circuit board 36 by being fixed onto the second circuit board 38. Wiring patterns 34a and 34b are formed on the second circuit board 38. External terminals 28 and 29 of solid electrolytic capacitor are fixed directly onto the wiring patterns 34a and 34b respectively, and electrical connection is provided therebetween.

With this structure, effects similar to those of FIG. 5 can be obtained. Additionally, because wiring patterns can be formed on both sides of the two circuit boards constituting the multilayered circuit board, the area thereof can further be reduced.

Third Exemplary Embodiment

A specific description is provided of the third exemplary embodiment hereinafter with reference to the accompanying drawing.

Figure 7:
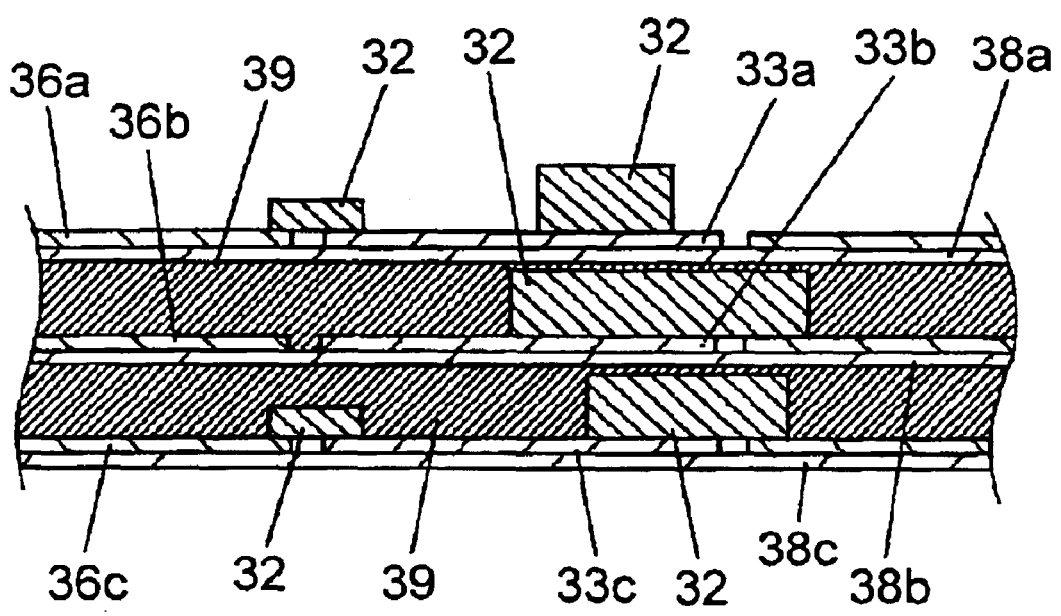
FIG. 7 is a sectional view of a circuit module in accordance with a third exemplary embodiment of the present invention.

FIG. 7 is a sectional view of a circuit module in accordance with the third exemplary embodiment of the present invention.

Circuit boards having openings 36a, 36b, and 36c and circuit boards for mounting 38a, 38b, and 38c have structures similar to those of the second exemplary embodiment shown in FIG. 6, except that circuit boards 36a, 36b, and 36c also have wiring patterns (not shown) thereon. Solid electrolytic capacitors 33a, 33b, and 33c have a structure as described in the second exemplary embodiment. The thickness of circuit boards 36a, 36b, and 36c is substantially equal to the thickness of sheet-like solid electrolytic capacitors 33a, 33b, and 33c. Some components 32 are mounted so as to bridge the capacitors and the circuit boards having openings, and have electrical connection with the outside thereof. Circuit boards 36a, 36b, and 36c incorporating components 32 and solid electrolytic capacitors 33a, 33b, and 33c, and circuit boards 38a, 38b, and 38c are disposed to form horizontal layers facing each other. Gaps between the components and these boards are filled with filling material 39 and bonded. At this time, these boards are electrically connected to one another by providing electrical connection between parts of wiring patterns.

With this structure, because respective solid electrolytic capacitors 33a, 33b, and 33c and corresponding components 32 are easily connected to each other on one side thereof and wiring patterns can be eliminated, the resistance component (ESR) and reactance component (ESL) are reduced.

Further, the layered structure can reduce the area required for mounting. Additionally, because solid electrolytic capacitors 33a, 33b, and 33c and components 32 inside of the multilayered circuit board can be shut out from the outside by filling material 39 and the circuit boards, they are unsusceptible to environment. This increases the reliability of the circuit module.

INDUSTRIAL APPLICABILITY

As described above, the present invention provides a circuit module structured so that a sheet-like solid electrolytic capacitor is embedded into a circuit board and other components and integrated circuits are mounted directly on or under the solid electrolytic capacitor. The area and volume required for mounting can be reduced. Further, connection that can be performed without additional wiring can reduce electrical loss like ESR and ESL in the circuit and especially improve high-frequency characteristics.

What is claimed is:

1. A circuit module incorporating a sheet-like solid electrolytic capacitor into a circuit board, wherein said sheet-like solid electrolytic capacitor comprises a valve metal sheet body having a porous surface on at least a part of one side thereof, a dielectric layer formed on the porous surface, a solid electrolyte covering said dielectric layer, and a current collector layer formed on a surface of said solid electrolyte.

2. The circuit module of claim 1, wherein said sheet-like solid electrolytic capacitor further includes an outer insulator covering an entire surface of said sheet-like solid electrolytic capacitor, the outer insulator has a first through hole filled with a conductor reaching said valve metal sheet body and a second through hole filled with a conductor reaching said current collector layer.

3. The circuit module of claim 1, wherein a recess formed in said circuit board receives said sheet-like solid electrolytic capacitor, and said circuit board and said sheet-like solid electrolytic capacitor are electrically connected to each other.

4. The circuit module of claim 3, wherein said sheet-like solid electrolytic capacitor further includes a first lead terminal connected to the first through hole and a second lead terminal connected to the second through hole on the same surface of the outer insulator, and one of the first lead terminal and the second lead terminal is connected to said circuit board.

5. The circuit module of claim 3, wherein said sheet-like solid electrolytic capacitor further includes a first external terminal connected to said valve metal sheet body and a second external terminal connected to said current collector layer, and one of the first external terminal and the second external terminal is connected to said circuit board.

6. The circuit module of claim 3, wherein said circuit board further includes a through hole filled with a conductor on a bottom face of the recess thereof, and one of the first external terminal and the second external terminal of said sheet-like solid electrolytic capacitor is connected to said circuit board via the through hole.

7. The circuit module of claim 1, wherein said circuit board has an opening, and the opening receives said sheet-like solid electrolytic capacitor.

8. The circuit module of claim 1, wherein the circuit module comprises, a laminated board having a plurality of said circuit boards laminated one on another, at least one of the plurality of circuit boards has an opening, and said sheet-like solid electrolytic capacitor is received in the opening and connected to another circuit board adjacent to the circuit board having the opening.

9. The circuit module of claim 5, wherein the circuit module comprises a laminated board having a plurality of said circuit boards laminated one on another, at least one of the plurality of circuit boards has an opening, said sheet-like solid electrolytic capacitor is received in the opening, and one of the first external terminal and the second external terminal is connected to another circuit board adjacent to the circuit board having the opening.

10. The circuit module of claim 3, wherein said sheet-like solid electrolytic capacitor has a plurality of first lead terminals and a plurality or second lead terminals on the same face of the outer insulator.

11. The circuit module of claim 3, wherein said sheet-like solid electrolytic capacitor has a plurality of first lead terminals and a plurality of second lead terminals on the same race of the outer insulator, at least one of the first lead terminals and the second lead terminals is connected to said circuit board, at least another one of the first lead terminals and the second lead terminals is connected to another electronic component.

12. The circuit module of claim 11, wherein the other electronic component includes a semiconductor component.

13. The circuit module of claim 1, wherein the circuit module comprises a laminated board having a plurality of said circuit boards laminated one on another, arid at least one of the plurality of said circuit boards incorporates said sheet-like solid electrolytic capacitor therein.

14. The circuit module of claim 1, wherein the circuit module comprises a laminated board having a plurality of said circuit boards laminated one on another, and a surface layer of the laminated board incorporates said sheet-like solid electrolytic capacitor therein.

15. The circuit module of claim 2, wherein the circuit module comprises a laminated board having a plurality of said circuit boards laminated one on another, and at least one or the plurality of said circuit boards incorporates said sheet-like solid electrolytic capacitor having an electronic component connected to the same face of the outer insulator.

16. The circuit module of Claim 2, wherein a recess formed in said circuit board receives said sheet-like solid electrolytic capacitor, and said circuit board and said sheet-like solid electrolytic capacitor are electrically connected to each other.

17. The circuit module of claim 2, wherein said circuit board has an opening, and the opening receives said sheet-like solid electrolytic capacitor.

18. The circuit module of claim 2, wherein the circuit module comprises a laminated board having a plurality of said circuit boards laminated one on another, at least one of the plurality of circuit boards has an opening, and said sheet-like solid electrolytic capacitor is received in the opening and connected to another circuit board adjacent to the circuit board having the opening.

19. The circuit module of claim 2, wherein the circuit module comprises a laminated board having a plurality of said circuit boards laminated one on another, and at least one of the plurality of said circuit boards incorporates said sheet-like solid electrolytic capacitor therein.

20. The circuit module of claim 2, wherein the circuit module comprises a laminated board having a plurality of said circuit boards laminated one on another, and a surface layer of the laminated board incorporates said sheet-like solid electrolytic capacitor therein.

* * * * *